US008885303B2

(12) United States Patent
Lin et al.

(10) Patent No.: US 8,885,303 B2
(45) Date of Patent: Nov. 11, 2014

(54) ELECTRONIC DEVICE OF PREVENTING POOR HEAT DISSIPATION AND HAVING ESD PROTECTION AND PROTECTION METHOD FOR THE SAME

(75) Inventors: Meng-Kai Lin, Taipei Hsien (TW); Ying-Hong Shen, Taipei Hsein (TW)

(73) Assignee: Wistron Corp., New Taipei (TW)

( * ) Notice: Subject to any disclaimer, the term of this patent is extended or adjusted under 35 U.S.C. 154(b) by 132 days.

(21) Appl. No.: 13/354,335

(22) Filed: Jan. 20, 2012

(65) Prior Publication Data

US 2012/0243131 A1 Sep. 27, 2012

(30) Foreign Application Priority Data

Mar. 22, 2011 (TW) .............................. 100109739 A

(51) Int. Cl.
*H05K 9/00* (2006.01)
*G06F 1/18* (2006.01)

(52) U.S. Cl.
CPC .............. *H05K 9/0067* (2013.01); *G06F 1/182* (2013.01)
USPC .......................................................... 361/1

(58) Field of Classification Search
CPC .... H05K 9/0067; H05K 1/0275; G06F 1/181; H02H 1/0007; H02H 5/04
USPC .......................................................... 361/1
See application file for complete search history.

(56) References Cited

U.S. PATENT DOCUMENTS

| 6,026,492 | A | * | 2/2000 | Cromer et al. | 726/35 |
| 6,469,626 | B1 | * | 10/2002 | Hung | 340/568.2 |
| 7,247,791 | B2 | * | 7/2007 | Kulpa | 174/50 |
| 7,978,070 | B2 | | 7/2011 | Hunter | |
| 2008/0055030 | A1 | * | 3/2008 | Grow et al. | 335/285 |
| 2008/0284610 | A1 | * | 11/2008 | Hunter | 340/657 |

FOREIGN PATENT DOCUMENTS

| CN | 1998080 A | 7/2007 |
| CN | 201303424 Y | 9/2009 |
| TW | M370142 | 12/2009 |
| TW | 201103401 A | 1/2011 |

OTHER PUBLICATIONS

Corresponding TW Office Action & its English translation, Oct. 23, 2013.
The office action of the corresponding Chinese application.

* cited by examiner

*Primary Examiner* — Jared Fureman
*Assistant Examiner* — Kevin J Comber
(74) *Attorney, Agent, or Firm* — CKC Partners Co., Ltd.

(57) ABSTRACT

An electronic device of preventing poor heat dissipation and having ESD protection and a protection method for the electronic device are disclosed, in which the electronic device includes a main body, an outer covering, a processing unit and a protective device. The processing unit and the protective device are disposed in the main body. The protective device is coupled to the processing unit. When the outer covering and the main body are closed tightly, the protective device can send a warning signal to the processing unit.

10 Claims, 4 Drawing Sheets

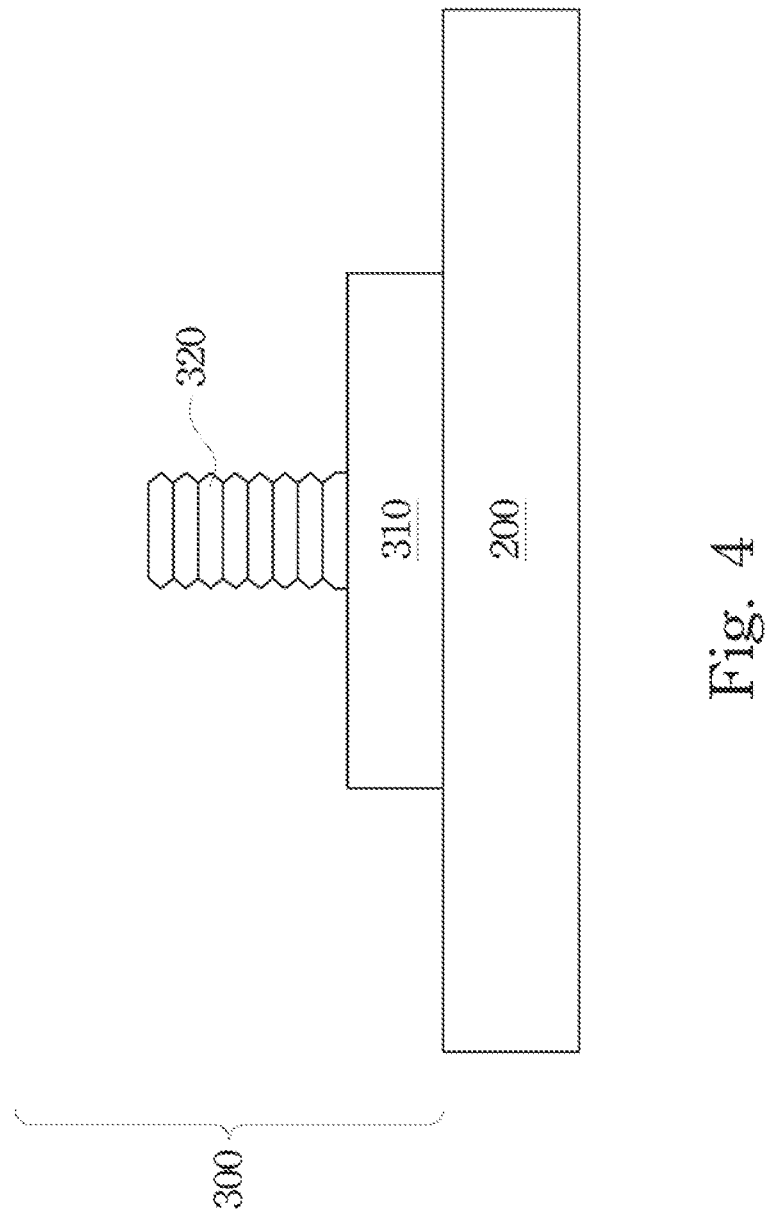

ELECTRONIC DEVICE OF PREVENTING POOR HEAT DISSIPATION AND HAVING ESD PROTECTION AND PROTECTION METHOD FOR THE SAME

RELATED APPLICATIONS

This application claims priority to Taiwan Application Serial Number 100109739, filed Mar. 22, 2011, which is herein incorporated by reference.

BACKGROUND

1. Technical Field

The present disclosure relates to an electronic device, and more particularly, an electronic device for preventing poor heat dissipation of a system and including ESD protection.

2. Description of Related Art

In recent years, due to industrial and commercial development and social progress, the products are also provided as being convenient, concrete, and cost-effective. Therefore, currently developed products are also more progressive than ever and can contribute to society.

Since many communication products nowadays are highly powered, dissipation technique for the products is getting more and more important in that case. However, users may disassemble an outer covering from the product on their own under the condition that the product is still powered, such that heat dissipation of a circuit board is poor, causing the system to be damaged.

Thus, there are still deficiencies and inadequacies apparently in the above existing mechanisms to be further improved. To solve the above problems, those skilled in the relevant art try to think and seek solutions, but there is no suitable way developed for a long time. Therefore, how to solve the problem of poor heat dissipation efficiently when the outer covering is disassembled from the product is one of the important research topics and also becomes an urgent aim needing to be improved in relevant art.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one aspect, the present invention is directed to an electronic device to solve the drawbacks before.

According to one embodiment of the present invention, the electronic device comprises a main body, an outer covering, a processing unit, and a protective device. The main body includes a circuit board. The outer covering includes a metal surface. The processing unit and the protective device are both disposed in the main body. The protective device is coupled with the processing unit. The protective device may send at least one warning signal to the processing unit so that the processing unit stops operating when the outer covering and the main body are not closed tightly.

The above protective device includes a first contact, a second contact and a first logic circuit. The first contact and the second contact are both disposed on the circuit board. The first contact is coupled to a ground terminal. The second contact is coupled to a positive voltage source. The first logic circuit is coupled to the first contact and the second contact. The first contact and the second contact touch the metal surface when the outer covering and the main body are closed tightly so that the first logic circuit outputs a first logic low level signal to the processing unit. When at least one of the first contact and the second does not touch the metal surface, the first logic circuit outputs a first logic high level signal as the warning signal to the processing unit.

The processing unit may continue to operate according to the first logic low level signal or stop operating according to the first logic high level signal.

For example, the above first logic circuit may be a first OR gate.

The above circuit board has a first corner and a second corner, which are diagonal to each other. The first contact is positioned at the first corner, and the second contact is positioned at the second corner.

The above protective device further includes a third contact, a fourth contact and a second logic circuit. The third contact and the fourth contact are both disposed on the circuit board. The third contact is coupled to the ground terminal. The fourth contact is coupled to the positive voltage source. The second logic circuit is coupled to the third contact and the fourth contact. The third contact and the fourth contact touch the metal surface when the outer covering and the main body are closed tightly so that the second logic circuit outputs a second logic low level signal to the processing unit. The second logic circuit outputs a second logic high level signal as the at least one warning signal to the processing unit when at least one of the third contact and the fourth contact fails to touch the metal surface.

The processing unit may continue to operate according to the second logic low level signal or stop operating according to the second logic high level signal.

For example, the second logic circuit may be a second OR gate.

The above circuit board also has a third corner and a fourth corner, which are diagonal to each other and separated with the first corner and the second corner. The third contact is disposed at the third corner and the fourth contact is disposed at the fourth corner.

Each of the above contacts includes a connection pad and a spring. The connection pad is joined to the circuit board. The spring is disposed on the connection pad.

According to another embodiment of the present invention, a protection method for an electronic device is disclosed herein. The protection method includes the steps as follows. A first contact and a second contact on a circuit board of a main body touch a metal surface of an outer covering and a first logic low level signal is outputted to a processing unit when the outer covering of the electronic device and the main body are closed tightly. A first logic high level signal is outputted as at least one warning signal to the processing unit when at least one of the first contact and the second contact fails to touch the metal surface of the outer covering. The processing unit continues to operate according to the first logic low level signal or stops operating according to the first logic high level signal.

In one embodiment, a third contact and a fourth contact on the circuit board of the main body touch the metal surface of the outer covering and a second logic low level signal is outputted to the processing unit when the outer covering and the main body are closed tightly. A second logic high level signal is outputted as the at least one warning signal to the processing unit when at least one of the third contact and the fourth contact fails to touch the metal surface of the outer covering. The processing unit continues to operate according to the second logic low level signal or stops operating according to the second logic high level signal.

In conclusion, compared with the related art, the protective device and the protection method of the present invention have several advantages. Using the present invention can lead to great advance, be widely used in industry and has at least the following characteristics:

1. If users disassemble the outer covering from the product on their own, the processing unit may stop operating temporarily to avoid destroying its system because of poor heat dissipation; and 2. Using the protective device may avoid ESD attack, eliminating or significantly reducing the damage of the processing unit and the backend circuit thereof.

BRIEF DESCRIPTION OF THE DRAWINGS

The invention can be more fully understood by reading the following detailed description of the embodiments, with reference made to the accompanying drawings as follows:

FIG. 4 is a side view of a contact according to one embodiment of the present invention.

DETAILED DESCRIPTION

Figure 1:
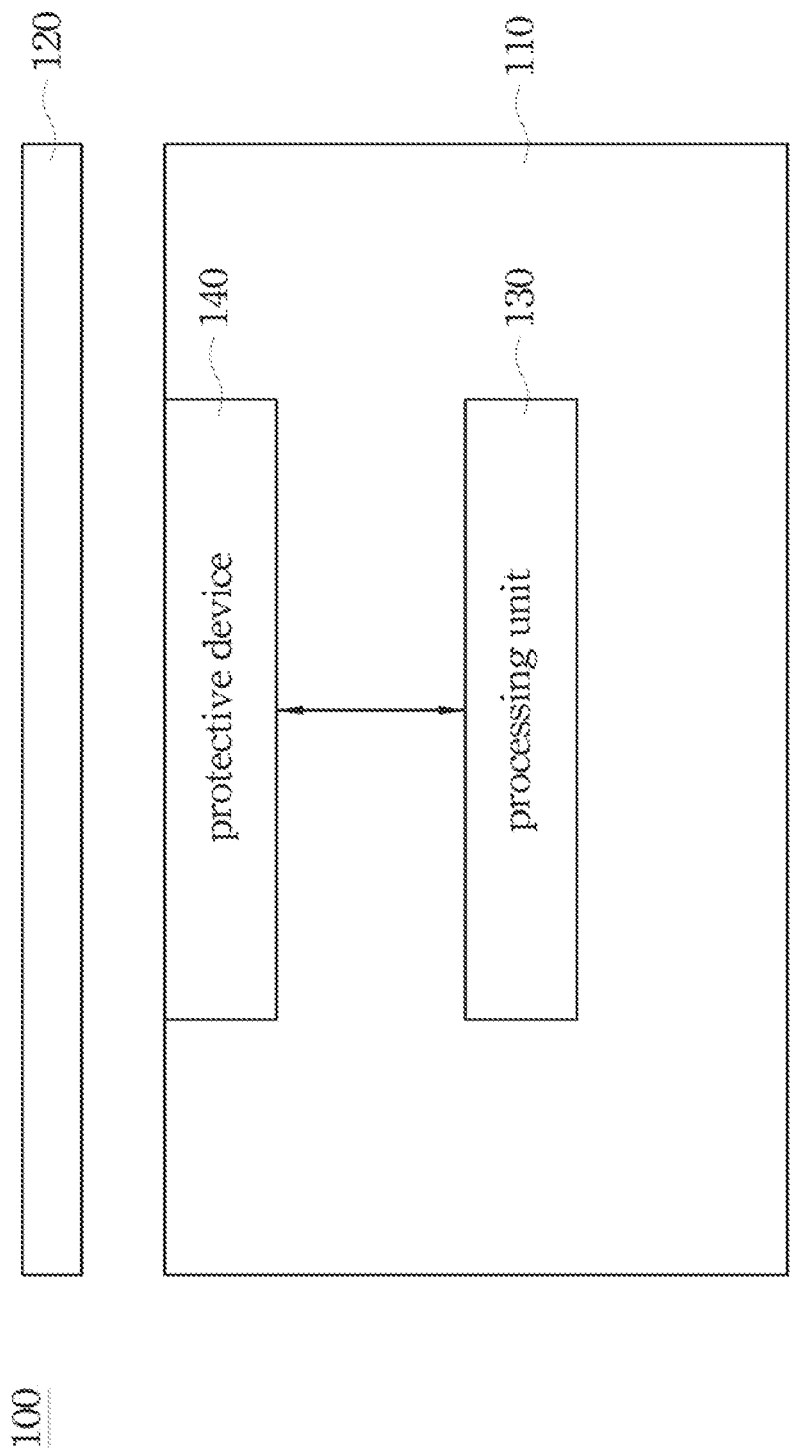
FIG. 1 is a block diagram of an electronic device according to one embodiment of the present invention.

In the following detailed description, for purposes of explanation, numerous specific details are set fourth in order to attain a thorough understanding of the disclosed embodiments. It will be apparent, however, that one or more embodiments may be practiced without these specific details. In other instances, well-known structures and devices are schematically shown in order to simplify the drawing.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In one or more various aspects, the present disclosure is directed to an is electronic device that can resist a differential power analysis attack efficiently or be widely used in similar art.

FIG. 1 is a block diagram of an electronic device 100 according to one embodiment of the present invention. The electronic device 100 may be applied in communication products or widely used in the relevant art. As shown in FIG. 1, the electronic device 100 includes a main body 110, an outer covering 120, a processing unit 130 and a protective device 140. The processing unit 130 may be a central processing unit, a microprocessor or similar devices.

The processing unit 130 and the protective device 140 are both disposed in the main body 110, and the protective device 140 is coupled to the processing unit 130. The protective device 130 may be adopted to prevent the ESD attack, eliminating or significantly reducing damage of the processing unit 130 and a backend circuit thereof.

In practice, the protective device 140 may send at least one warning signal to the processing unit 130 when the outer covering 120 and the main body 110 are not closed tightly so that the processing unit 130 stops operating to avoid destroying the system because of poor heat dissipation.

Figure 2:
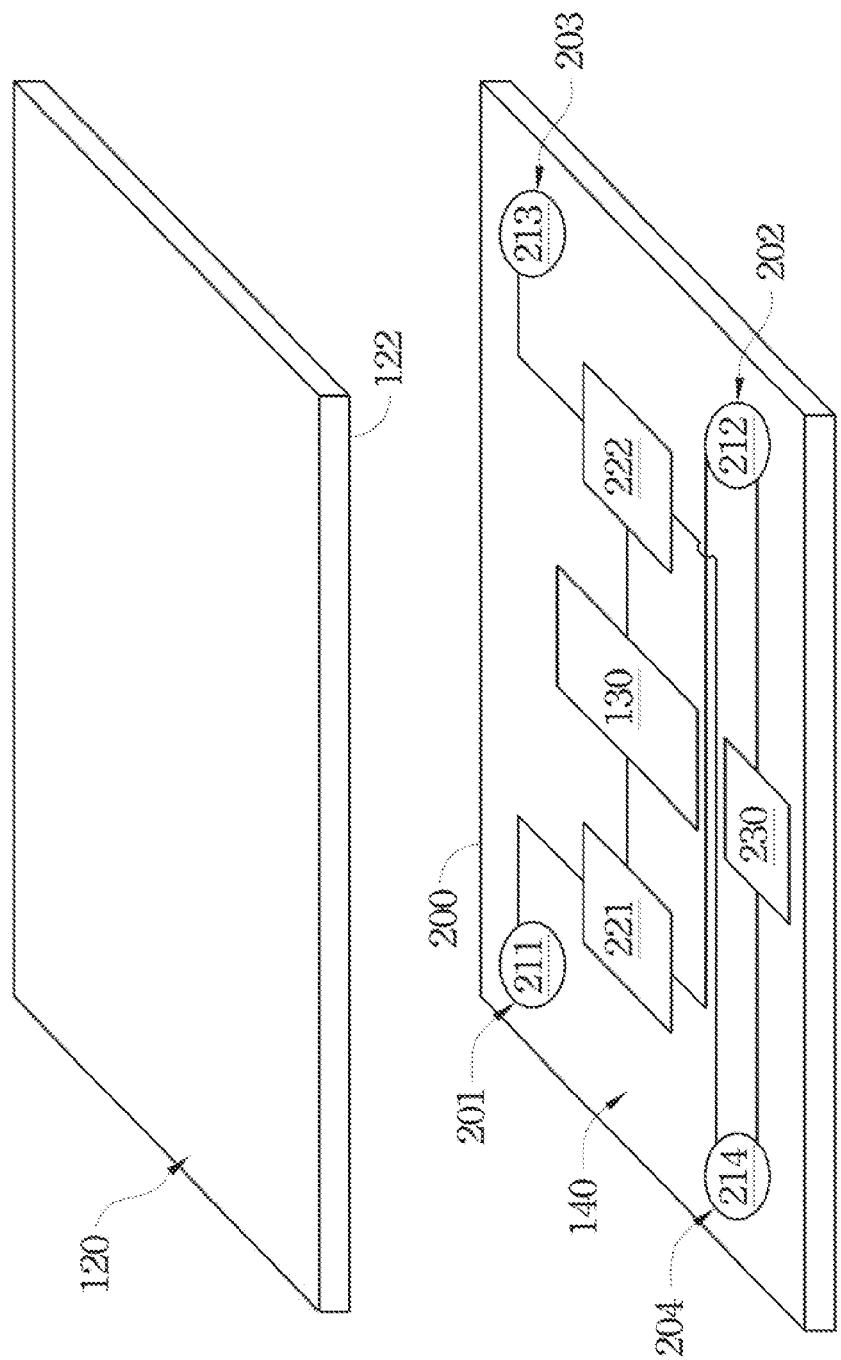
FIG. 2 is a diagram of the protective device according to one embodiment of the present invention.
Figure 3:
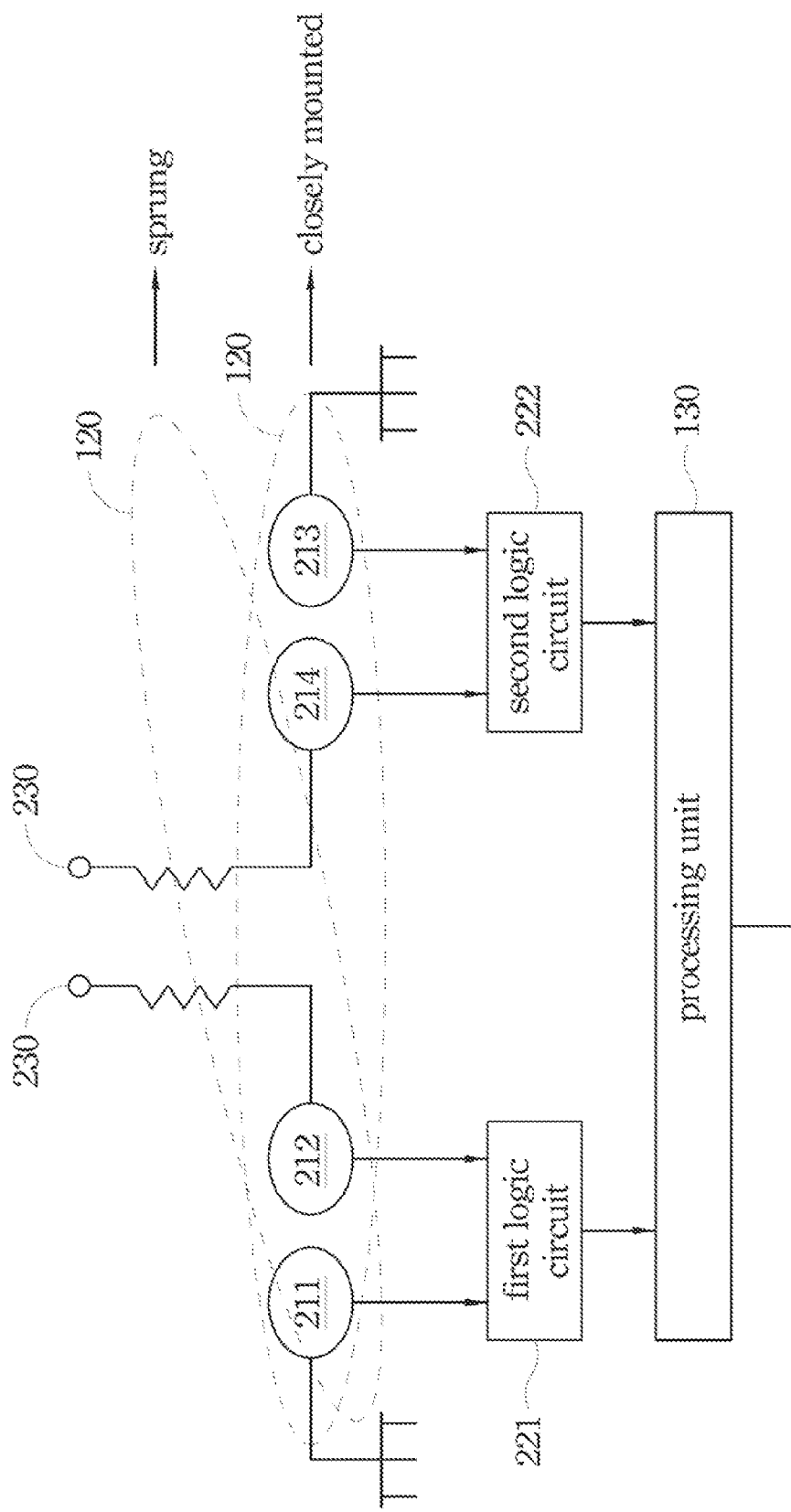
FIG. 3 is a diagram of the protective device when the outer covering is sprung or closely mounted.

Referring to FIG. 2 and FIG. 3 for more detailed illustration of the electronic device 100, FIG. 2 is a diagram of the protective device 140 according to one embodiment of the present invention, and FIG. 3 is a diagram of the protective device 140 when the outer covering 120 is sprung or closely mounted.

As shown in FIG. 2, the outer covering 120 has a metal surface 122, the protective device 140 includes a circuit board 200, a first contact 211, a second contact 212 and a first logic circuit 221. The metal surface 122 has a function of heat dissipation and is a medium such that the first contact 211 and the second contact 212 are conducted to each other when the outer covering 120 and the main body 110 are closed tightly.

The first contact 211 and the second contact 212 are both disposed on the circuit board 200, the first contact 211 is coupled to a ground terminal, the second contact 212 is coupled to a positive voltage source 230, and the first logic circuit 221 is coupled to the first contact 211 and the second contact 212. Hence, the first logic circuit 221 is destroyed even by ESD attack, thereby eliminating or significantly reducing the damage of the processing unit and the backend circuit thereof.

The first contact 211 and the second contact 212 touch the metal surface 122 when the outer covering 120 and the main body 110 are closed tightly so that the first logic circuit 221 may output a first logic low level signal to the processing unit 130. The first logic circuit 221 outputs a first logic high level signal as the warning signal to the processing unit 130 when at least one of the first contact 211 and the second contact 212 fails to touch the metal surface 122. The processing unit 130 may continue to operate according to the first logic low level signal or stop operating according to the first logic high level signal so as to avoid destroying the system because of poor heat dissipation.

For example, the first logic circuit 221 may be a first OR gate. If the outer covering 120 and the main body 110 are closed tightly, the first contact 211 and the second contact 212 touch the metal surface 122, thus the first contact 211 and the second contact 212 are conducted to each other so that the first OR gate outputs a first logic low level signal. When at least one of the first contact 211 and the second contact 212 fails to touch the metal surface 122, i.e., the outer covering 120 is disassembled or separated from the main body 110, the first contact 211 and the second contact 212 are not conducted to each other, the first contact 211 still connects to ground and the second contact 212 is at a logic high level due to the positive voltage source 230 such that the first OR gate outputs a first logic high level signal.

The circuit board 200 has a first corner 201 and a second corner 202, which are diagonal to each other, the first contact 211 is positioned at the first corner 201, and the second contact 212 is positioned at the second corner 202. Compared with two contacts are disposed at the same side of the circuit board, disposing the first contact 211 and the second contact 212 diagonally may efficiently detect if the outer covering 120 is disassembled or separated from the main body 110.

The protective device 140 further includes a third contact 213, a fourth contact 214 and a second logic circuit 222. The third contact 213 and the fourth contact 214 are both disposed on the circuit board 200, the third contact 213 are coupled to the ground terminal, the fourth contact is coupled to the positive voltage source 230, and the second logic circuit 222 is coupled to the third contact 213 and the fourth contact 214. Therefore, the first logic circuit 221 or the second logic circuit 222 is destroyed even by ESD attack, thereby eliminating or significantly reducing the damage of the processing unit and the backend circuit thereof.

The third contact 213 and the fourth contact 214 touch the metal surface 122 when the outer covering 120 and the main body 110 are closed tightly so that the second logic circuit 222 outputs a second logic low level signal to the processing unit 130. The second logic circuit 222 outputs a second logic high level signal as the above warning signal to the processing unit 130 when at least one of the third contact 213 and the fourth contact 214 fails to touch the metal surface 122. The processing unit 130 may continue to operate according to the second logic low level signal or stop operating according to the second logic high level signal so as to avoid destroying the system because of poor heat dissipation.

For example, the second logic circuit 222 may be a second OR gate. If the outer covering 120 and the main body 110 are closed tightly, the third contact 213 and the fourth contact 214 touch the metal surface 122, thus the third contact 213 and the fourth contact 214 are conducted to each other so that the second OR gate outputs a second logic low level signal. When at least one of the third contact 213 and the fourth contact 214 fails to touch the metal surface 122, i.e., the outer covering 120 is disassembled or separated from the main body 110, the third contact 213 and the fourth contact 214 are not conducted to each other, the third contact 213 still connects to ground and the fourth contact 214 is at a logic high level because of the positive voltage source 230 so that the second OR gate outputs a second logic high level signal.

The circuit board 200 also has the third corner 203 and the fourth corner 204, which are diagonal to each other and are separated with the first corner 201 and the second corner 202. The third contact 213 is disposed at the third corner 203 and the fourth contact 214 is disposed at the fourth corner 204. By disposing the first contact 211, the second contact 212, the third contact 213 and the fourth contact 214 at four corners can detect the outer covering 120 is disassembled or separated from the main body 110 more efficiently.

Though in FIG. 2 the processing unit 130, the first logic circuit 221, the second logic circuit 222 and the positive voltage source 230 are all disposed on the circuit board 200, it is not limiting of the present invention. In other embodiments, the processing unit, the first logic circuit, the second logic circuit and the positive voltage source may also be disposed on other circuit boards. In addition, those with ordinary skill in the art may flexibly choose the configuration manner of disposing some on the circuit board 200 and the others on other circuit boards based on the desired application, rather than totally disposing all of the foregoing devices on the circuit board 200 or other circuit boards.

FIG. 4 is a side view of a contact 300 according to one embodiment of embodiment of the present invention. The contact 300 may be any above contact such as the first contact 211, the second contact 212, the third contact 213 or the fourth contact 214. The contact 300 may include a connection pad 310 and a spring 320. The connection pad 310 is joined to the circuit board 200. The spring 320 is disposed on the connection pad 310. In practice, the shape of the spring 320 may be spiral or similar shape.

The other aspect of the present invention is a protection method of the electronic device 100. The protection method may be used in the above protective device 140 or be applied to similar hardware devices. The protection method includes the steps as follows. The first contact 211 and the second contact 212 on the circuit board 200 of the main body 110 touch the metal surface 122 of the outer covering 120, and a first logic low level signal is outputted to the processing unit 130, when the outer covering 120 of the electronic device 100 and the main body 110 are closed tightly. A first logic high level signal is outputted as the at least one warning signal to the processing unit 130 when at least one of the first contact 211 and the second contact 212 fails to touch the metal surface of the outer covering 120. The processing unit 130 continues to operate according to the first logic low level signal or stops operating according to the first logic high level signal.

Furthermore, a third contact 213 and a fourth contact 214 on the circuit board 200 of the main body 110 touch the metal surface 122 of the outer covering 120, and a second logic low level signal is outputted to the processing unit 130, when the outer covering 120 and the main body 110 are closed tightly. A second logic high level signal is outputted as the at least one warning signal to the processing unit 130 when at least one of the third contact 213 and the fourth contact 214 fails to touch the metal surface 122 of the outer covering 120. The processing unit 130 continues to operate according to the second logic low level signal or stops operating according to the second logic high level signal.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. An electronic device comprising:
   a main body comprising a circuit board;
   an outer covering having a metal surface;
   a central processing unit disposed in the main body; and
   a protective device disposed in the main body, the protective device coupled to the central processing unit and configured to send at least one warning signal to the central processing unit so that the central processing unit stops operating when the outer covering and the main body are not closed tightly, wherein the protective device comprises: a first contact disposed on the circuit board; a second contact disposed on the circuit board; and a first logic circuit coupled to the first contact and the second contact, wherein the first logic circuit is directly connected to the central processing unit, wherein the first contact and the second contact touch the metal surface when the outer covering and the main body are closed tightly so that the first logic circuit outputs one first logic signal to the central processing unit, and the first logic circuit outputs an other first logic signal as the at least one warning signal to the central processing unit when at least one of the first contact and the second contact fails to touch the metal surface, wherein a level of said one first logic signal is different from a level of said other first logic signal, wherein the central processing unit continues to operate according to said one first logic signal or stops operating according to said other first logic signal.

2. The electronic device of claim 1, wherein the first logic circuit is a first OR gate.

3. The electronic device of claim 1, wherein the circuit board has a first corner and a second corner, which are diagonal to each other, the first contact is positioned at the first corner, and the second contact is positioned at the second corner.

4. The electronic device of claim 3, wherein the protective device further comprises:

a third contact disposed on the circuit board;

a fourth contact disposed on the circuit board; and a second logic circuit coupled to the third contact and the fourth contact, wherein the third contact and the fourth contact touch the metal surface when the outer covering and the main body are closed tightly so that the second logic circuit outputs one second logic signal to the central processing unit, and the second logic circuit outputs an other second logic signal as the at least one warning signal to the central processing unit when at least one of the third contact and the fourth contact fails to touch the metal surface, wherein a level of said one second logic signal is different from a level of said other second logic signal.

5. The electronic device of claim 4, wherein the central processing unit continues to operate according to said second logic signal or stops operating according to said other second logic signal.

6. The electronic device of claim 4, wherein the second logic circuit is a second OR gate.

7. The electronic device of claim 4, wherein the circuit board has a third corner and a fourth corner, which are diagonal to each other and separated with the first corner and the second corner, the third contact is disposed at the third corner and the fourth contact is disposed at the fourth corner.

8. The electronic device of claim 4, wherein each of the contacts comprises:

a connection pad joined to the circuit board; and a spring disposed on the connection pad.

9. A protection method for an electronic device, the protection method comprising:

a first contact and a second contact on a circuit board of a main body touching a metal surface of an outer covering, and outputting one first logic signal by a first logic circuit to a central processing unit, when the outer covering of the electronic device and the main body are closed tightly, wherein the first contact and the second contact are coupled to the first logic circuit, and the first logic circuit is directly connected to the central processing unit;

outputting an other first logic signal as at least one warning signal to the central processing unit when at least one of the first contact and the second contact fails to touch the metal surface of the outer covering, wherein a level of said one first logic signal is different from a level of said other first logic signal; and the central processing unit continuing to operate according to said one first logic signal or stopping operating according to said other first logic signal.

10. The protection method of claim 9, further comprising:

a third contact and a fourth contact on the circuit board of the main body touching the metal surface of the outer covering, and outputting one second logic signal to the central processing unit, when the outer covering and the main body are closed tightly;

outputting an other second logic signal as the at least one warning signal to the central processing unit when at least one of the third contact and the fourth contact fails to touch the metal surface of the outer covering, wherein a level of said one second logic signal is different from a level of said other second logic signal; and the central processing unit continuing to operate according to said one second logic signal or stopping operating according to said other second logic signal.

* * * * *